(12) United States Patent
Wallace et al.

(10) Patent No.: US 7,759,028 B2
(45) Date of Patent: Jul. 20, 2010

(54) SUB-RESOLUTION ASSIST FEATURES

(75) Inventors: Charles H. Wallace, Portland, OR (US);
Swaminathan Sam Sivakumar,
Portland, OR (US); Paul A. Nyhus,
Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/623,615

(22) Filed: Nov. 23, 2009

(65) Prior Publication Data

US 2010/0068633 A1 Mar. 18, 2010

Related U.S. Application Data

(62) Division of application No. 10/933,625, filed on Sep. 2, 2004, now Pat. No. 7,632,610.

(51) Int. Cl.
*G03F 1/00* (2006.01)
(52) U.S. Cl. .......................................................... 430/5
(58) Field of Classification Search ..................... 430/5, 430/312, 394; 716/19, 21
See application file for complete search history.

(56) References Cited

U.S. PATENT DOCUMENTS

| | | | |
|---|---|---|---|
| 5,364,718 A | 11/1994 | Oae et al. | |
| 6,335,130 B1 | 1/2002 | Chen et al. | |
| 6,363,097 B1 | 3/2002 | Linke et al. | |
| 6,541,167 B2 | 4/2003 | Petersen et al. | |
| 2002/0192575 A1 | 12/2002 | Stanton | |
| 2003/0064298 A1 | 4/2003 | Broeke et al. | |
| 2003/0152843 A1 | 8/2003 | Tang | |
| 2004/0091790 A1 | 5/2004 | Chen et al. | |
| 2004/0166418 A1 | 8/2004 | Samuels | |
| 2004/0170905 A1 | 9/2004 | Liebmann et al. | |
| 2005/0074698 A1 | 4/2005 | Borodovsky | |
| 2005/0106473 A1 | 5/2005 | Huang | |

OTHER PUBLICATIONS

Dammel, R., "The Role of Resists in Extending Optical Lithography", *Semiconductor Fabtech*—10th Ed., pp. 253-264, Feb. 4, 2005.

*Primary Examiner*—Mark F Huff
*Assistant Examiner*—Rashid Alam
(74) *Attorney, Agent, or Firm*—Blakely, Sokoloff, Taylor & Zafman LLP

(57) ABSTRACT

Systems and techniques relating to the layout and use of sub-resolution assist features. In one implementation, a mask includes a first feature and a second feature separated from each other by a gap and a sub-resolution assist feature bridging the gap between the first feature and the second feature.

22 Claims, 7 Drawing Sheets

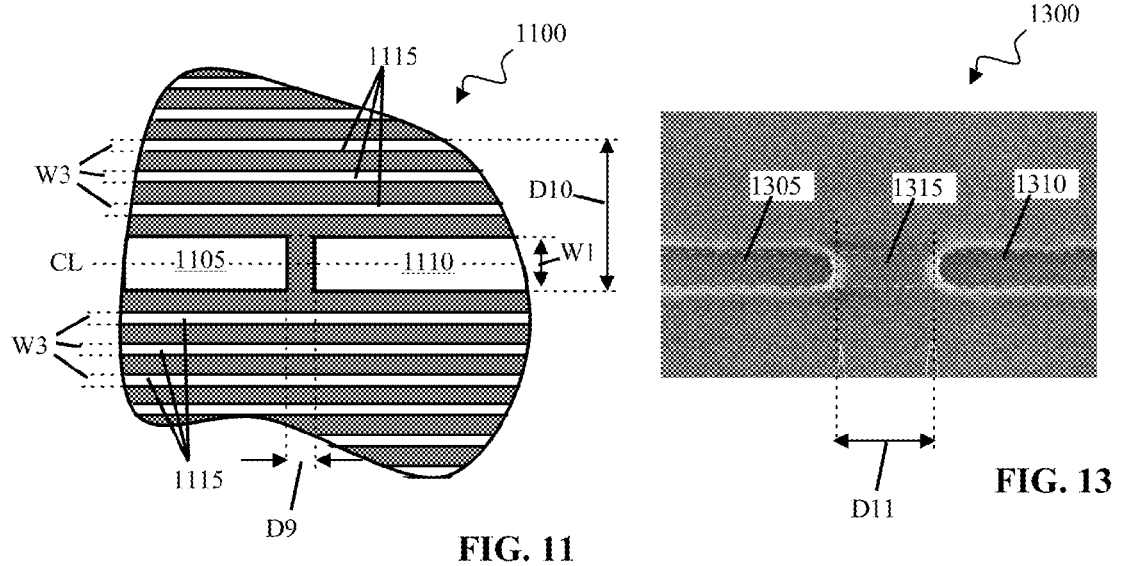
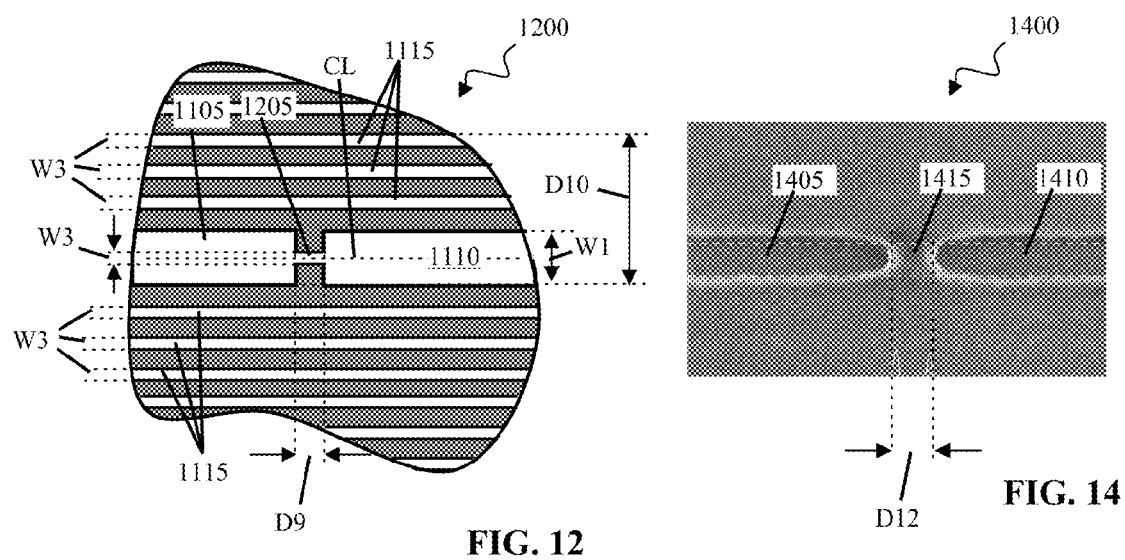

SUB-RESOLUTION ASSIST FEATURES

CROSS-REFERENCE TO RELATED APPLICATIONS

This application is a divisional application of and claims priority to U.S. application Ser. No. 10/933,625, filed on Sep. 2, 2004, the contents of which are incorporated herein by reference.

BACKGROUND

This disclosure relates to the layout and use of sub-resolution assist features.

Various systems may be used to print features such as patterns that define integrated circuits on semiconductor wafers. In general, electromagnetic wave emissions from a source are directed to expose selected locations on a substrate while leaving other locations unexposed. Example emissions include visible light, ultraviolet (UV) and extreme ultraviolet (EUV) radiation, and X-rays. These emissions all have characteristic wavelengths in various media.

Example approaches to directing these emissions toward selected locations include selective attenuation (e.g., using binary photomasks), interference (e.g., using phase shifting masks), reflection (e.g., using EUV reflective optical elements), and beam steering. Regardless of the approach used, systems for printing features have a resolution limit below which certain features are not resolved during printing.

DESCRIPTION OF DRAWINGS

FIGS. 11 and 12 show implementations of mask layouts that reduce or eliminate pullback.

FIG. 13 shows a scanning electron microscope image obtained using the mask layout of FIG. 11.

FIG. 14 shows a scanning electron microscope image obtained using the mask layout of FIG. 12.

Like reference symbols in the various drawings indicate like elements.

DETAILED DESCRIPTION

Figure 1:
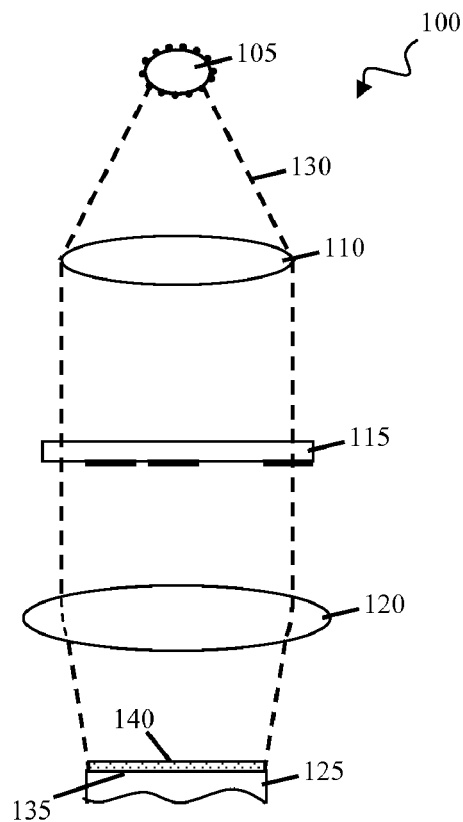
FIG. 1 shows a block diagram of a patterning system.

FIG. 1 shows a patterning system 100. System 100 includes an illumination source 105, an illumination system 110, a mask 115, an imaging system 120, and a substrate 125.

Illumination source 105 generates electromagnetic radiation 130. Radiation 130 can be adapted for use in lithographic patterning of microelectronic devices to expose photosensitive materials. Radiation 130 can be fully or partially coherent in that the emitted optical waves maintain a fixed and predictable phase relationship with each other for a period of time. Radiation 130 has a characteristic wavelength in various portions of system 100, including in the vicinity of substrate 125.

Illumination system 110 can include an aperture, a condenser, as well as additional devices for collecting, shaping, collimating, directing, filtering, and focusing radiation 130 emitted from source 105.

Mask 115 is positioned in system 100 by a mask stage to influence the incidence of radiation 130 upon substrate 125. Mask 115 can include different regions that transmit electromagnetic radiation 130 with different transmissivities and/or phases. The transmission of electromagnetic radiation 130 by mask 115 can be engineered to image a pattern of desired features on substrate 125. For example, mask 115 can be a binary mask or mask 115 can be a phase shifting mask (such as a alternating phase shifting mask or an embedded phase shifting mask). Mask 115 can transmit radiation 130 (as shown) or mask 115 can reflect radiation 130.

Imaging system 120 can include an aperture, an objective, as well as additional devices for collecting, filtering, and focusing the portion of radiation 130 that passes through mask 115 onto substrate 125. For example, imaging system 120 can include a filtering projection lens and/or reduction optics.

Substrate 125 is a workpiece to be patterned by system 100. Substrate 125 includes a working surface 135 that includes a photosensitive material 140. Substrate 125 can be presented to system 100 by a vacuum chuck or other support such that radiation 130 is focused in the vicinity of working surface 135 to image desired features in photosensitive material 140.

Given the optical characteristics and wavelength of radiation 130 defining the resolution limit of system 100, the dimensions and arrangement of features that can be imaged in photosensitive material 140 are limited. For example, certain features may have too small a pitch to be imaged using radiation 130 and thus fall below the resolution limit of system 100. As another example, adjacent features may be so closely spaced that radiation 130 diffracts and/or constructively or destructively interferes to make the printing of such features more difficult.

Figure 2:
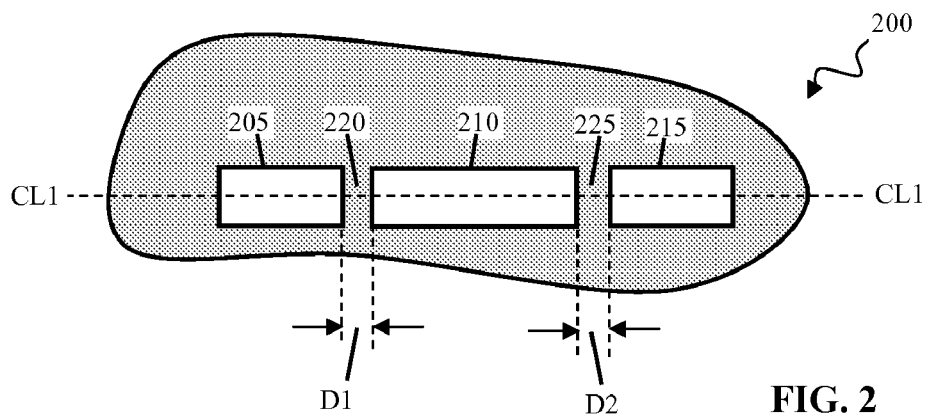
FIGS. 2 and 3 illustrate one type of difficulty that arises with the printing of closely spaced features.
Figure 3:
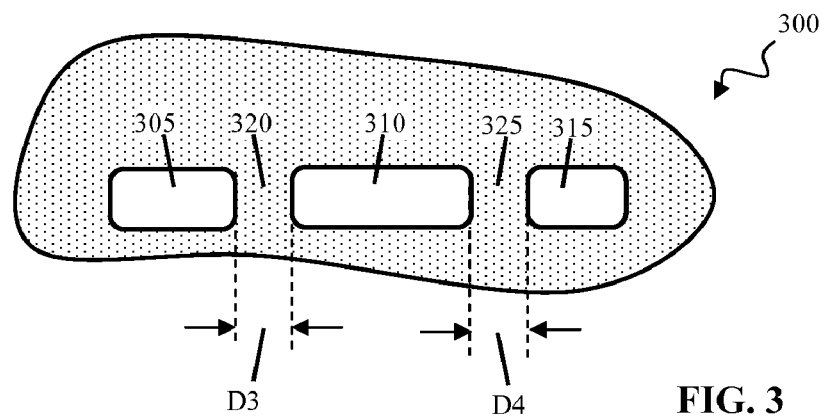

FIGS. 2 and 3 show an example of one type of difficulty that arises with the printing of closely spaced features. FIG. 2 shows a design as drawn 200 that includes a group of adjacent features 205, 210, 215 centered about a centerline CL1. Design as drawn 200 is the desired layout of features 205, 210, 215 after printing. Features 205, 210 are separated by a gap 220 having a separation dimension D1. Features 210, 215 are separated by a gap 225 having a separation dimension D2. Features 205, 210, 215 can be linear features in that features 205, 210, 215 are generally elongate with substantially parallel edges.

FIG. 3 shows an example printed image 300 that was intended to accord with design as drawn 200. Printed image 300 includes a group of adjacent features 305, 310, 315 that were each intended to correspond to the respective of features 205, 210, 215. However, features 305, 310 are separated by a gap 320 having a separation dimension D3, and features 310, 315 are separated by a gap 325 having a separation dimension D4. Dimension D3 is greater than dimension D1, and dimension D4 is greater than dimension D2. The difference between dimension D1 and dimension D3 and the difference between dimension D2 and dimension D4 is termed "pullback." Thus $$\text{Pullback}_{31} = D3 - D1 \qquad \text{Equation 1}$$

$$\text{Pullback}_{42} = D4 - D2 \qquad \text{Equation 2}$$

Pullback can have a variety of deleterious effects on the printing of features such as features 305, 310, 315. In particular, small separation gaps may not be readily attainable. Device size may be increased. Also, the printed features may be irreproducible. Further, traditional approaches to accommodating pullback, such as the inclusion of dog-ears and hammerheads on features, are high mask error enhancement factor (MEEF) locations. In other words, such locations may be difficult to fabricate and likely to bridge or pinch. Dog-ears and hammerheads may interact with other, neighboring features in dense patterns. When the features are included in patterns that define integrated circuits, the operational characteristics of the integrated circuits can be impacted by such errors and/or irreproducibility.

Figure 4:
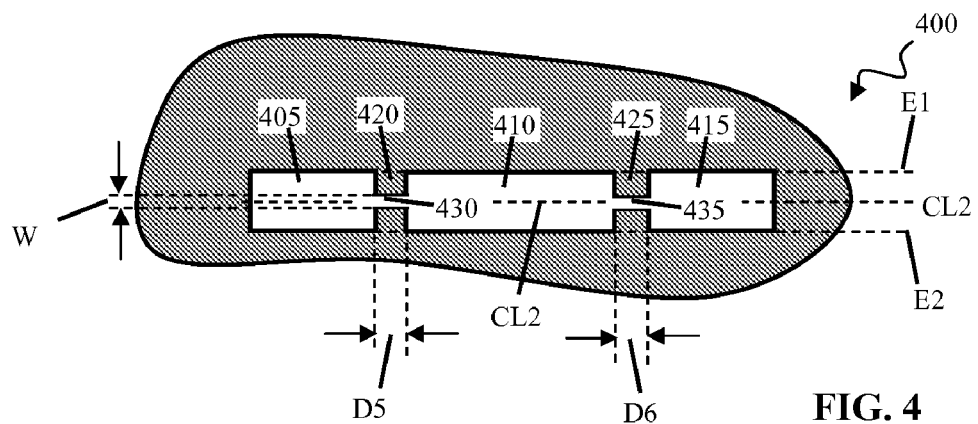
FIG. 4 shows a mask layout that reduces or eliminates pullback.

FIG. 4 shows a mask layout 400 that reduces or eliminates pullback to print design as drawn 200. Layout 400 includes a group of features 405, 410, 415 centered about a centerline CL2. Features 405, 410, 415 extend between a first edge E1 and a second edge E2. Features 405, 410 are separated by a gap 420 having a separation dimension D5. Features 410, 415 are separated by a gap 425 having a separation dimension D6. Gap 420 includes a sub-resolution assist feature 430. Gap 425 includes a sub-resolution assist feature 435. Features 405, 410, 415, 430, 435 are thus be included in a single mask. Sub-resolution assist features 430, 435 are positioned between edges E1, E2.

Sub-resolution assist features are elements in mask layouts that enhance the printing of features using the mask. Sub-resolution assist features are generally dimensioned below the resolution limit of the system used to print with the mask. Sub-resolution assist features can be adapted to a variety of masks and a variety of patterning systems. For example, sub-resolution assist features can direct electromagnetic radiation with different transmissivities and/or phases. Sub-resolution assist features can transmit or reflect the electromagnetic radiation used to print or sub-resolution assist features can block or fail to reflect the electromagnetic radiation used to print (depending, e.g., on whether positive or negative photosensitive materials are used). Thus, depending on the nature of the mask, features 405, 410, 415, 430, 435 can transmit/reflect/block/or fail to do the same with different transmissivities and/or phases, as appropriate.

Sub-resolution assist feature 430 can bridge gap 420 to join features 405, 410. Sub-resolution assist feature 435 can bridge gap 425 to join features 410, 415. Sub-resolution assist features 430, 435 can have a width W that is below the resolution limit of the electromagnetic radiation used to print design as drawn 200. Sub-resolution assist features 430, 435 can be positioned in the vicinity of centerline CL2. For example, sub-resolution assist features 430, 435 can be approximately centered on centerline CL2. Sub-resolution assist features 430, 435 can be substantially linear features that are collinear with linear features 405, 410, 415.

Figure 5:
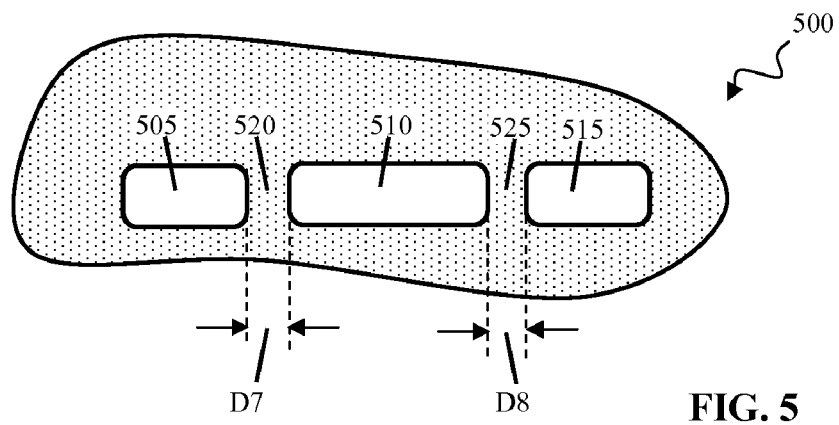
FIG. 5 shows an example printed image that was printed using the mask layout of FIG. 4.

FIG. 5 shows an example image 500 printed using the mask layout 400 (FIG. 4). Printed image 500 is intended to accord with design as drawn 200. Printed image 500 includes a group of adjacent features 505, 510, 515 that were each intended to correspond to the respective of features 205, 210, 215. Features 505, 510 are separated by a gap 520 having a separation dimension D7, and features 510, 515 are separated by a gap 525 having a separation dimension D8. Features 505, 510 are not joined at gap 520, nor are features 510, 515 joined at gap 525.

Depending on the dimensions and arrangement of sub-resolution assist feature 430, dimension D7 can be greater than or about the same as dimension D5. Depending on the dimensions and arrangement of sub-resolution assist feature 435, dimension D8 can be greater than or about the same as dimension D6. Once again, the difference between dimensions D7 and D5 and the difference between dimensions D8 and D6 are termed "pullback" and are given by:

$$\text{Pullback}_{75} = D7 - D5 \qquad \text{Equation 3}$$

$$\text{Pullback}_{86} = D8 - D6 \qquad \text{Equation 4}$$

Table 1 shows one example of how the dimensions and arrangements of sub-resolution assist features (such as sub-resolution assist features 430, 435) can impact pullback. Table 1 includes the results of aerial image simulations for sub-resolution assist features that bridge end-to-end separation gaps. In the simulations, a nested gap (glass on a 6% ePSM mask) with a minimum size gap of 0.12 μm and without dog-ears, hammerheads, or other known optical proximity correction features was used to generate aerial images. The normalized image log slope (NILS) of the gap and the pullback from the 0.12 μm as-drawn gap was extracted from the aerial image to generate the data in the row labeled "NO SRAF." The NILS and pullback were extracted from the calculated aerial image for a range of sub-resolution assist features that were collinear with opposing features and that bridged the feature ends. The range of sub-resolution assist features had a variety of widths ranging between 0.02 μm and 0.05 μm. Given the as-drawn gap width of 0.12 μm (which corresponds to the length of a bridging sub-resolution assist feature), the range of sub-resolution assist features thus have a width-to-length ratio of between about 1-to-6 and about 5-to-12 for the given NILS.

TABLE 1

| Gap SRAF Width (μm) | NILS | As-drawn Gap Width (Bridging SRAF Length) (μm) | DOF (μm) | Gap Printed CD (μm) | Pullback (μm) |
|---|---|---|---|---|---|
| NO SRAF | 3.21 | 0.12 | — | 0.191 | 0.071 |
| 0.02 | 2.82 | 0.12 | — | 0.168 | 0.048 |
| 0.025 | 2.68 | 0.12 | — | 0.160 | 0.040 |
| 0.03 | 2.51 | 0.12 | — | 0.150 | 0.030 |
| 0.035 | 2.31 | 0.12 | — | 0.138 | 0.018 |
| 0.04 | 2.06 | 0.12 | 0.44 | 0.124 | 0.004 |
| 0.045 | 1.74 | 0.12 | — | 0.105 | −0.015 |
| 0.05 | 1.26 | 0.12 | — | 0.076 | −0.044 |

The depth of focus (DOF) and gap printed critical dimension (GAP printed CD) are also given for at least a portion of the range of sub-resolution assist feature widths.

As indicated in Table 1, the pullback for as-drawn gaps without a sub-resolution assist feature (i.e., the "NO SRAF"

row) is calculated to have a pullback of about 0.035 μm per feature end, or about 0.071 μm total. On the other hand, the pullback with a 0.040 μm wide sub-resolution assist feature is calculated to have a pullback of about 0.02 μm per feature end, or about 0.04 μm total. The MEEF for the gap critical dimension (CD) as a response to SRAF width is −3.8.

Further, the DOF for the 0.04 μm wide sub-resolution assist feature is relatively large at 0.44 μm. The DOF for other widths is not given since the gaps printed using the widths were not dimensioned in the vicinity of the 0.12 μm target separation distance. The NILS with the sub-resolution assist features are smaller than the NILS without the sub-resolution assist features. However, the NILS with the sub-resolution assist features are comparable to the NILS where the mask is adjusted so that the gap prints at the 0.12 μm target separation distance. In particular, the NILS without the sub-resolution assist feature where the mask is adjusted is about 2.6 (rather than the NILS of 3.2 given in the "NO SRAF" row without either the sub-resolution assist feature or adjustment).

As can be seen, the use of sub-resolution assist features can allow two features to be drawn end-to-end at close proximity without an extreme mask bias. MEEF is reduced. The feature-to-print design process is simplified, and this simplification further reduces the MEEF.

Figure 6:
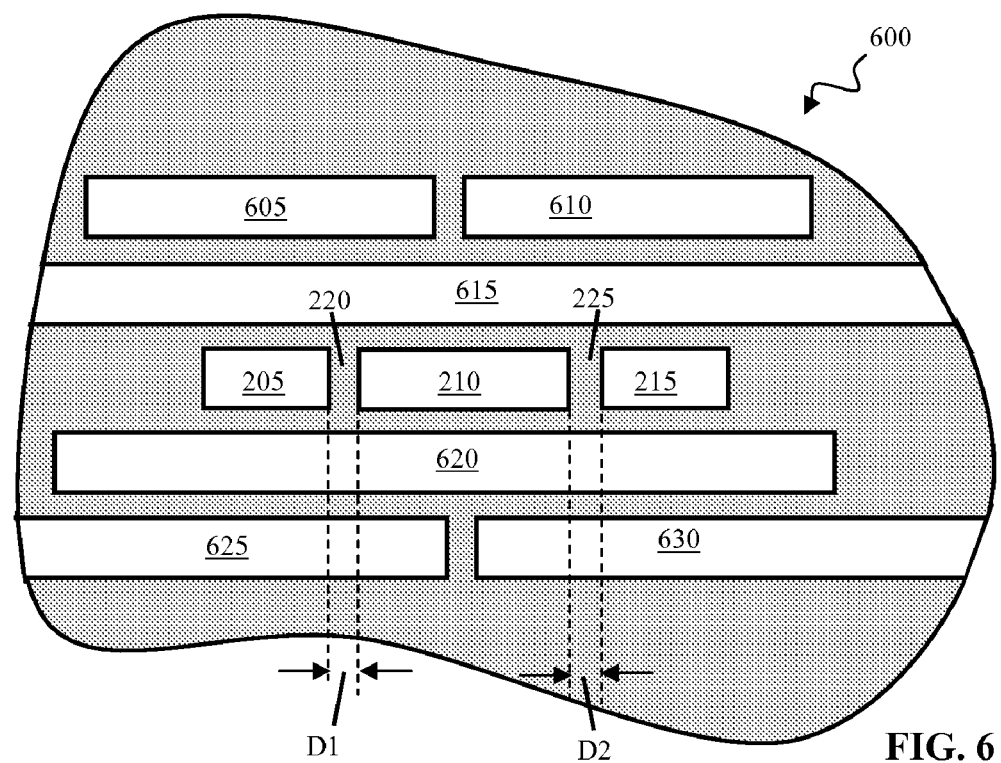
FIG. 6 shows an example of a dense pattern.

Further, end-to-end features can be printed in dense patterns without dog-ears, hammerheads, or other optical proximity correction features that may interact with laterally adjacent features. FIG. 6 shows an example of the design as drawn of such a dense pattern, namely a dense pattern 600. Dense pattern 600 includes features 205, 210, 215 in the midst of a collection of other features 605, 610, 615, 620, 625, 630.

Features 615, 620 neighbor features 205, 210, 215 in that features 615, 620 are laterally adjacent to features 205, 210, 215 and spaced close enough to features 205, 210, 215 so that, if features 205, 210, 215 were printed using dogear or hammerhead assist features, these assist features could interact with features 615, 620 during printing. Although the exact separation distance where such interaction occurs is a function of several factors (including the characteristics of the printing system and the wavelength of the exposure radiation), in general, features that are laterally positioned within one wavelength of gaps 220, 225 neighbor features 205, 210, 215.

Figure 7:
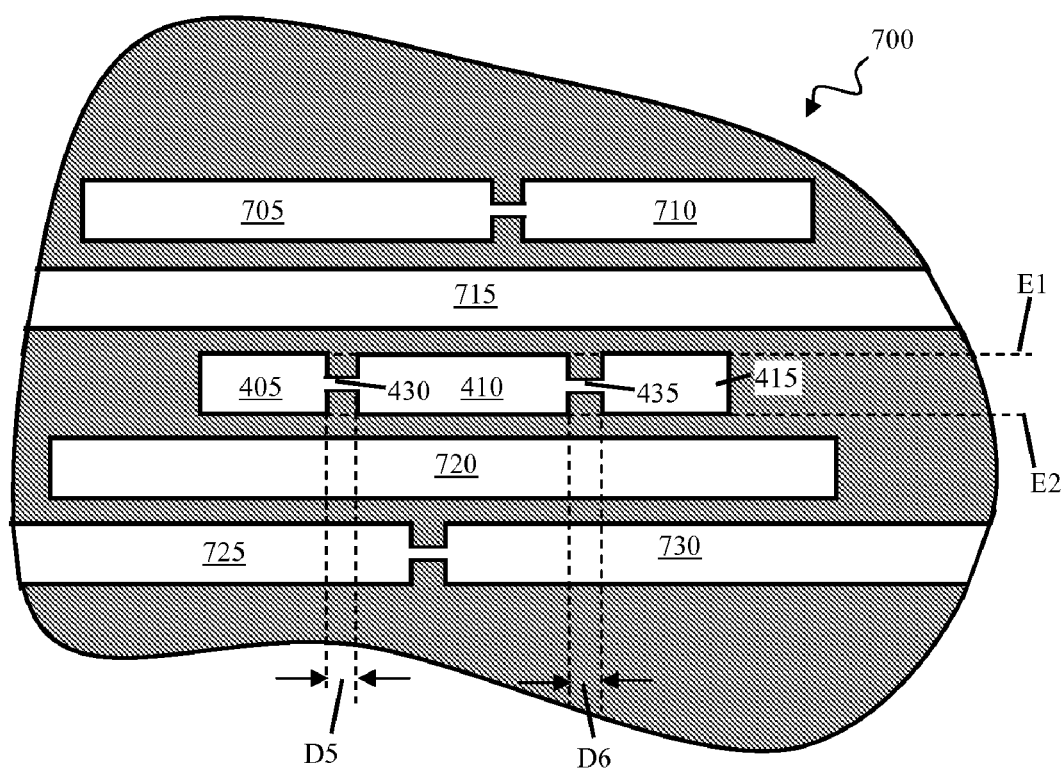
FIG. 7 shows a mask layout for printing the dense pattern of FIG. 6 with reduced or eliminated pullback.

FIG. 7 shows a mask layout 700 for printing dense pattern 600. Mask layout 700 includes features 405, 410, 415 in the midst of a collection of other features 705, 710, 715, 720, 725, 730. Features 705, 710, 715, 720, 725, 730 are arranged to direct electromagnetic radiation for the printing of the respective of features 605, 610, 615, 620, 625, 630. Features 615, 620 neighbor features 205, 210, 215.

As discussed above, given the inclusion of sub-resolution assist features 430, 435 in mask layout 700, features 205, 210, 215 can be printed with reduced pullback. Since sub-resolution assist features 430, 435 do not extend beyond edges E1, E2, neighboring features 715, 720 can be laterally adjacent to features 405, 410, 415.

Figure 8:
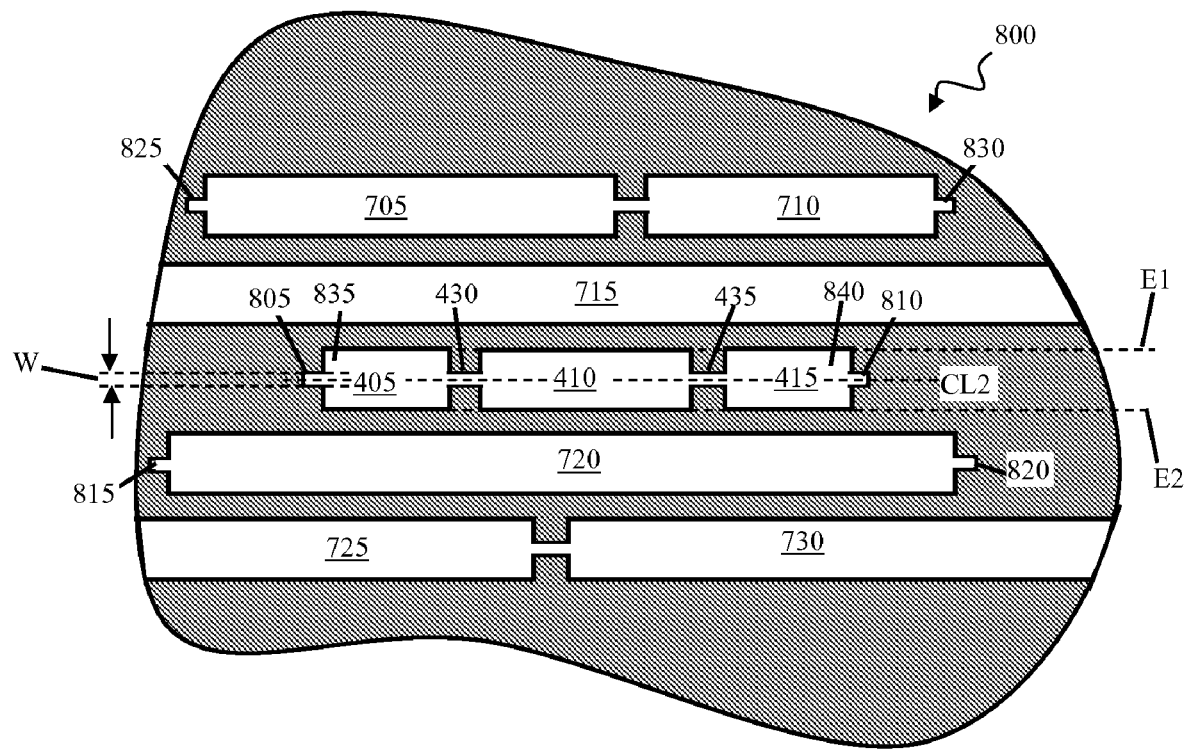
FIG. 8 shows another mask layout for printing the dense pattern of FIG. 6 with reduced or eliminated pullback.

FIG. 8 shows another mask layout 800 for printing dense pattern 600. In addition to features 405, 410, 415, 705, 710, 715, 720, 725, 730, mask layout 800 includes additional sub-resolution assist features 805, 810, 815, 820, 825, 830. Sub-resolution assist feature 805 extends beyond an outer end 835 of feature 405 and terminates without contacting another feature. Sub-resolution assist feature 810 extends beyond an outer end 840 of feature 415 and terminates without contacting another feature. Sub-resolution assist features 815, 820, 825, 830 each extend beyond ends of the corresponding of features 705, 710, 720 without contacting other features.

Sub-resolution assist features 805, 810 can be substantially linear features centered on centerline CL2. Sub-resolution assist features 805, 810 are disposed between edges E1, E2 and can have the same width W as features 430, 435. Sub-resolution assist features 815, 820, 825, 830 can be laid out similarly to features 805, 810.

The inclusion of sub-resolution assist features 805, 810 in mask layout 800 anchors the ends of features 205, 210, 215 printed by ends 835, 840. As a result, features 205, 210, 215 tend to be printed with a length that is closer to the length to features 405, 410, 415. Also, since sub-resolution assist features 205, 210, 215 do not extend beyond edges E1, E2, neighboring features 715, 720 can be spaced close to features 405, 410, 415.

Figure 9:
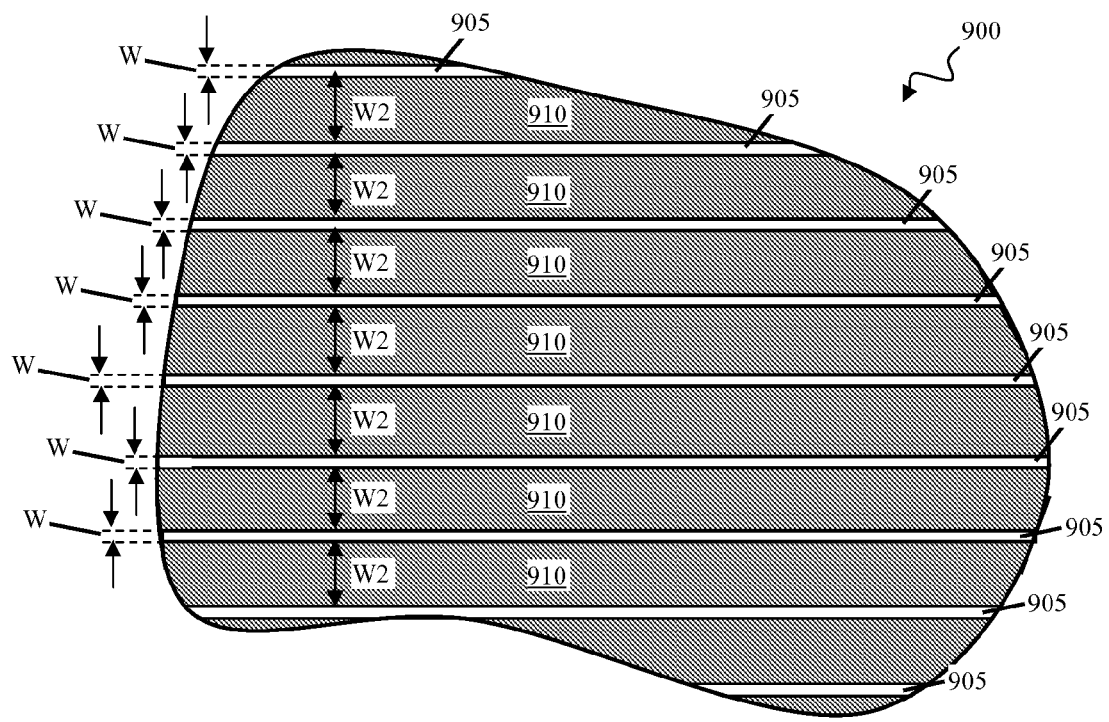
FIGS. 9 and 10 show the production of another mask layout for printing the dense pattern of FIG. 6 with reduced or eliminated pullback.
Figure 10:
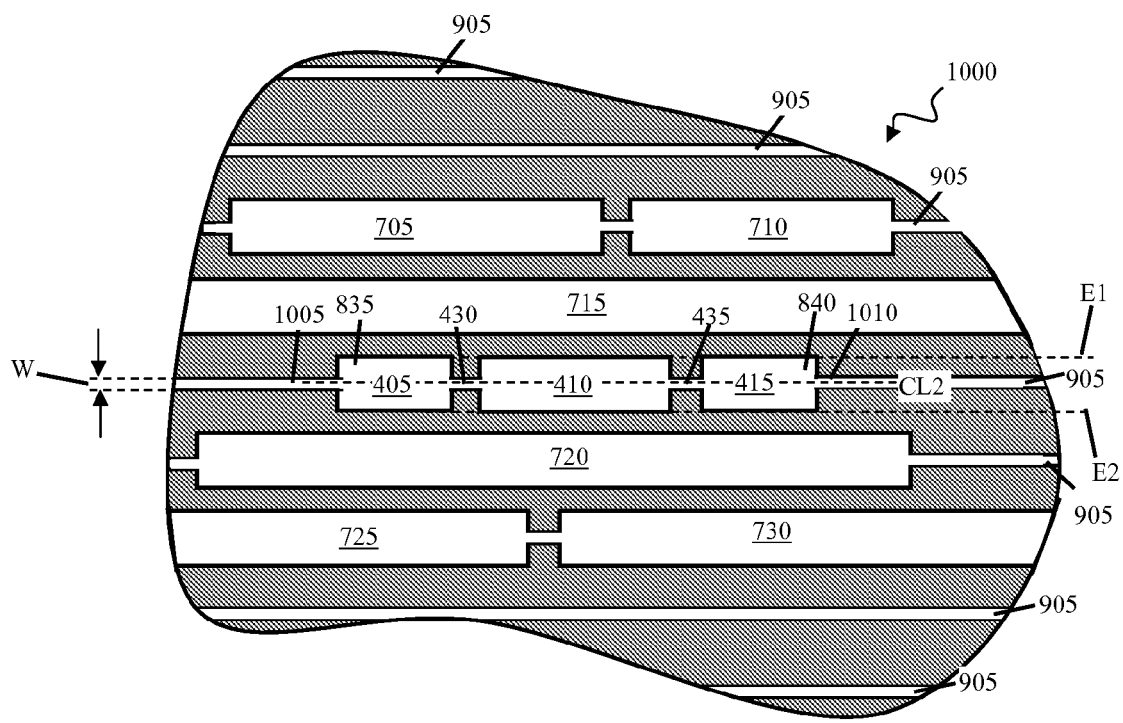

FIGS. 9 and 10 show the production of another mask layout 1000 for printing dense pattern 600. FIG. 9 shows a mask blank that has been patterned with a grating layout 900. Grating layout 900 is a collection of alternating lines 905 and spaces 910. Lines 905 can each have a width W that is below the resolution limit of the system that is to print pattern 600. Spaces 910 can each have a width W2 that is larger than width W. Grating layout 900 can cover the entirety of a mask or grating layout 900 can cover one or more layout portions on a mask.

Grating layout 900 can be formed using any of a number of different techniques, including e-beam lithography, ion-beam lithography, x-ray lithography, and imprint techniques. Also, grating layout 900 can be formed using interference lithography. When grating layout is formed with interference lithography, lines 905 and spaces 910 can display the definition characteristic of interference lithography and a $k_1$ factor that approaches 0.25 with minimal feature distortion of the type that arises due to imperfections in projection printing systems and techniques. For example, lines 905 and spaces 910 can be formed without imperfections that arise due to the use of a mask, lenses, projection optics, and/or the backscattering of electrons. Lines 905 and spaces 910 can also show the influence of the relatively large depth of focus provided by interferometric lithography techniques.

FIG. 10 shows a mask layout 1000 for printing dense pattern 600. To form mask layout 1000, features 405, 410, 415, 705, 710, 715, 720, 725, 730 have been added to mask layout 900. Features 405, 410, 415 can be centered on a centerline CL2 shared with a selected line 905. The selected line 905 can thus form sub-resolution assist feature 430 between opposing ends of features 405, 410 and sub-resolution assist feature 435 between opposing ends of features 410, 415. The selected line 905 can also form an extended sub-resolution assist feature 1005 that extends beyond outer end 835 of feature 405 and an extended sub-resolution assist feature 1010 that extends beyond outer end 840 of feature 415.

The inclusion of sub-resolution assist features 1005, 1010 in mask layout 1000 anchors the ends of features 205, 210, 215 printed by ends 835, 840.

The reduction of pullback when using sub-resolution assist features can be shown experimentally. FIGS. 11 and 12 show implementations of mask layouts 1100 and 1200. Layouts 1100, 1200 each include a pair of end-to-end line features 1105, 1110 and a collection of assist features 1115. Line features 1105, 1110 have a width W1 of about 80 nm. Line features 1105, 1110 are centered on centerline CL and have ends separated by a separation distance D9 of 110 nm. Assist features 1115 are positioned on either side of line features 1105, 1110. The outer edge of the third assist feature 1115 is a distance D10 of about 640 nm away from the opposite edge of line features 1105, 1110. Assist features 1115 have a width of about 50 nm.

In addition to features 1105, 1110, 1115, mask layout 1200 also includes a substantially linear sub-resolution assist feature 1205. Sub-resolution assist feature 1205 bridges the gap between the opposing ends of features 1105, 1110 and has the same width W3 (i.e., 50 nm) as features 1115. Sub-resolution assist feature 1205 is approximately centered on centerline CL.

Experimental results obtained using mask layouts 1100, 1200 display the reduction in pullback that can be obtained with the inclusion of sub-resolution assist feature 1205. FIG. 13 is a scanning electron microscope (SEM) image 1300 of a developed photoresist after exposure using a mask that includes layout 1100. Image 1300 shows a pair of end-to-end lines 1305, 1310 separated by a gap 1315. Gap 1315 maintains lines 1305, 1310 apart by a separation distance D11 of about 208 nm, for a pullback of about 50 nm per each of lines 1305, 1310.

FIG. 14 is a SEM image 1400 of a developed photoresist after exposure using a mask that includes layout 1200. Image 1400 shows a pair of end-to-end lines 1405, 1410 separated by a gap 1415. Gap 1415 maintains lines 1405, 1410 apart by a separation distance D12 of about 90 nm. The ends of lines 1405, 1410 are thus closer together than the ends of features 1105, 1110 in FIG. 12. The magnitude of this "negative" pullback is about 10 nm per each of lines 1405, 1410.

Figure 15:
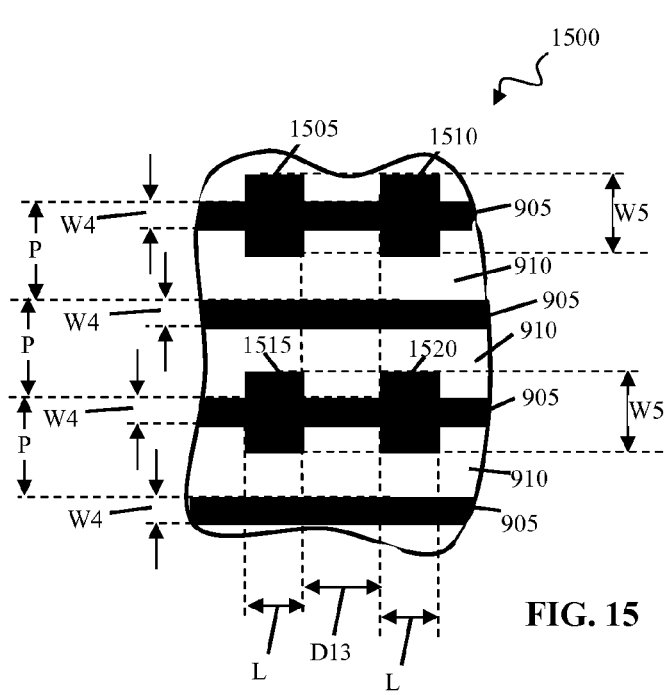
FIGS. 15 and 16 show implementations of mask layouts that reduce or eliminate pullback.
Figure 16:
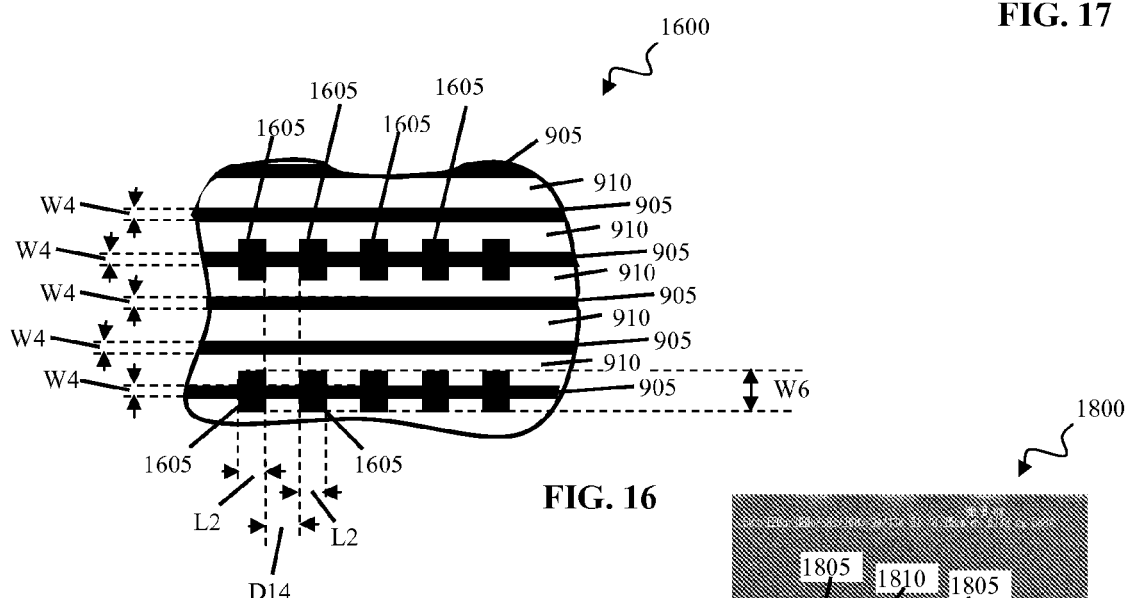

FIGS. 15-18 show further experimental results verifying the reduction of pullback when using sub-resolution assist features. FIGS. 15 and 16 show mask layouts 1500 and 1600. Layouts 1500 and 1600 both include a grating of alternating lines 905 and spaces 910 having a pitch P. Lines 905 have a width W4 so that they are below the resolution limit of the printing system that is to print with layouts 1500, 1600.

Layout 1500 includes a collection of contact features 1505, 1510, 1515, 1520 on every other line 905. Contact features 1505, 1510, 1515, 1520 can be used to print contacts in a microelectronic device such as contacts in a SRAM memory device. Contact features 1505, 1510, 1515, 1520 can each have a width W5 and a length L. Contact feature 1505 can be separated from contact feature 1510 by a separation distance D13. Contact feature 1515 can be separated from contact feature 1520 by separation distance D13.

Layout 1600 includes a collection of contact features 1605 on every third line 905. Contact features 1605 can be used to print contacts in a microelectronic device. Contact features 1605 can each have a width W6 and a length L2. Longitudinally adjacent pairs of contact features 1605 can be separated from one another by a separation distance D14.

Figure 17:
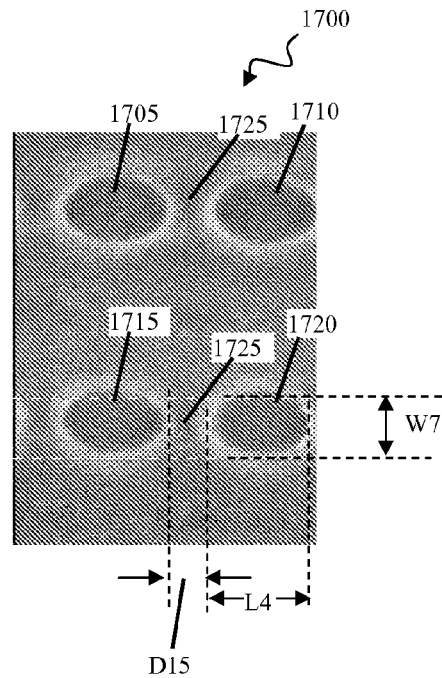
FIGS. 17 and 18 show scanning electron microscope images obtained using the mask layouts of FIGS. 15 and 16.

FIG. 17 is a SEM image 1700 of a developed photoresist after exposure using a mask that includes a particular implementation of layout 1500. For the imaged implementation of layout 1500, lines 905 had a width W4 of about 45 nm and a pitch P of about 160 nm. Contact features 1505, 1510, 1515, 1520 each had a width W5 of about 137 nm and a length L of about 100 nm. Contact features 1505, 1510 were separated by a separation distance D13 of about 120 nm, as were contact features 1515, 1520.

Image 1700 shows a collection of contact features 1705, 1710, 1715, 1720. Contact features 1715, 1720 each have a width W7 of about 92 nm and a length L4 of about 145 nm. Contact features 1715, 1720 are separated by a gap 1725. Gap 1725 maintains features 1715, 1720 apart by a separation distance D15 of about 75 nm, for a negative pullback of about 22 nm per each of features 1715, 1720.

Figure 18:
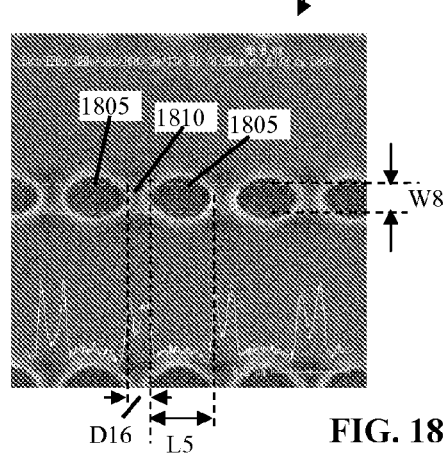

FIG. 18 is a SEM image 1800 of a developed photoresist after exposure using a mask that includes a particular implementation of layout 1600. For the imaged implementation of layout 1600, lines 905 had a width W4 of about 45 nm and a pitch P of about 160 nm. Contact features 1605 each had a width W6 of about 143 nm and a length L2 of about 100 nm. Longitudinally adjacent contact features 1605 were separated by a separation distance D14 of about 120 nm.

Image 1800 shows a collection of contact features 1805. Contact features 1805 each have a width W8 of about 79 nm and a length L5 of about 163 nm. Longitudinally adjacent contact features 1805 are separated by a gap 1810 that maintains a separation distance D16 of about 57 nm, for a negative pullback of about 32 nm per each feature 1605 in a longitudinally adjacent pair.

Figure 19:
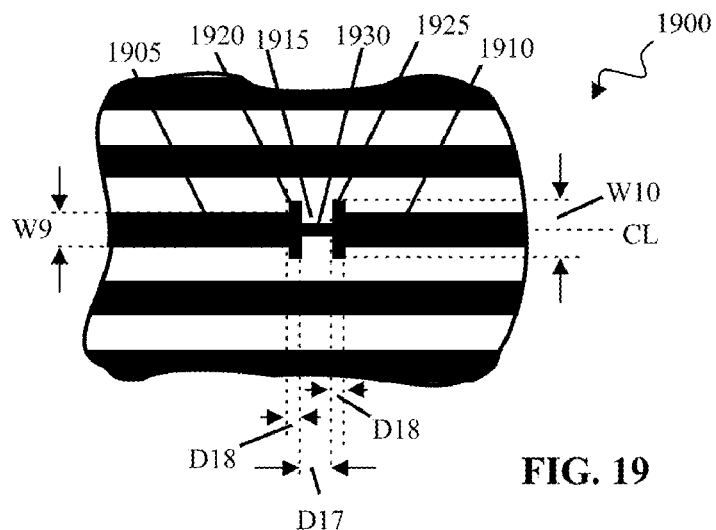
FIG. 19 shows an implementation of a mask layout that reduces or eliminates pullback.
Figure 20:
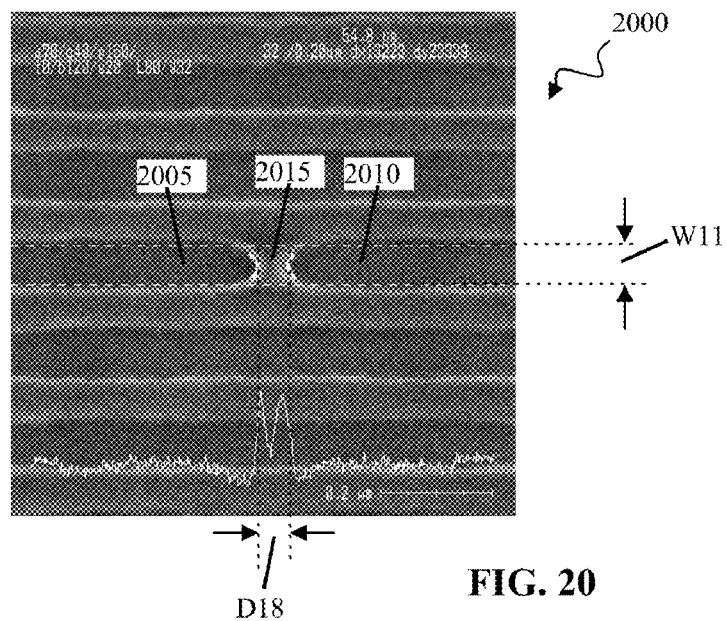
FIG. 20 shows a scanning electron microscope image obtained using the mask layout of FIG. 19.

FIGS. 19-20 show further experimental results verifying the reduction of pullback when using combinations of different types of sub-resolution assist features. FIG. 19 shows a mask layout 1900. Layout 1900 includes a first line feature 1905 and a second line feature 1910 centered about a centerline CL. Features 1905, 1910 are arranged end-to-end and separated by a gap 1915 having a separation dimension D17. Features 1905, 1910 have a width W9.

Feature 1905 includes a hammerhead sub-resolution assist feature 1920. Feature 1910 includes a hammerhead sub-resolution assist feature 1925. Hammerhead features 1920, 1925 both have a dimension D18 that is below the resolution limit of the system that is to print with layout 1900. Hammerhead features 1920, 1925 extend laterally beyond the edges of line features 1905, 1910 to have a width W10. Hammerhead feature width W10 is thus greater than line feature width W9.

Gap 1915 between line features 1905, 1910 includes a sub-resolution assist feature 1930. Sub-resolution assist feature 1930 can bridge gap 1915 to join features 1905, 1910. Sub-resolution assist feature 1930 can be positioned in the vicinity of centerline CL. For example, sub-resolution assist features 1930 can be approximately centered on centerline CL. Sub-resolution assist feature 1930 can be substantially collinear with linear features 1905, 1910.

FIG. 20 is a SEM image 2000 of a developed photoresist after exposure using a mask that includes a particular implementation of layout 1900. For the imaged implementation of layout 1900, features 1905, 1910 have a width W9 of about 80 nm, gap 1915 has a separation dimension D17 of about 68 nm, and hammerhead features 1920, 1925 have a width W10 of about 136 nm and a dimension D18 of about 32 nm.

Image 2000 shows a pair of line features 2005, 2010. Line features 2005, 2010 both have a width W11 of about 85 nm. Line features 2005, 2010 are separated by a gap 2015 that maintains a separation distance D18 of about 55 nm, for a negative pullback of about 7 nm per each of features 2005, 2010.

Figure 21:
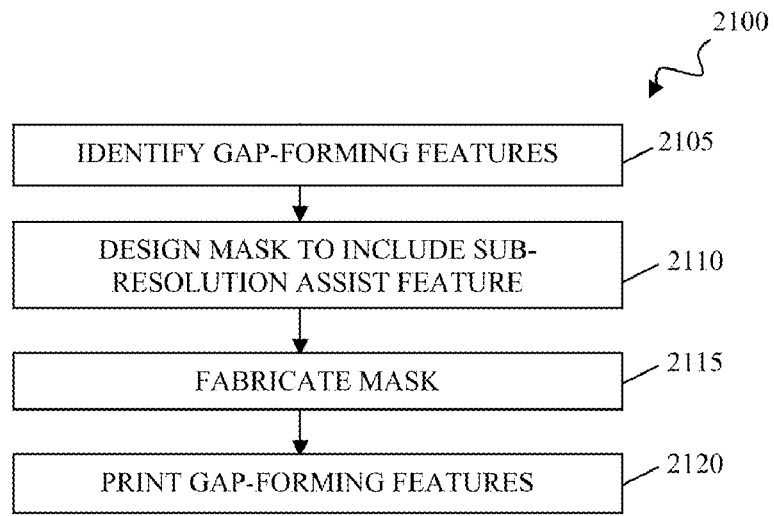
FIG. 21 is a flowchart of an implementation of a process for printing gap-forming features.

FIG. 21 shows an implementation of a process 2100 for printing closely spaced features. Process 2100 may be performed by one or more actors (such as a device manufacturer, a mask manufacturer, or a foundry), acting alone or in concert. Process 2100 may also be performed in whole or in part by a data processing device executing a set of machine-readable instructions. For example, masks may be designed to accommodate diffraction using optical proximity correction (OPC) or other software. The software can be tangibly embodied in a machine-readable medium such as a compact disc (CD), a disc drive, or other data storage device.

The actor performing process 2100 identifies gap-forming features in a desired pattern at 2105. Gap-forming features can be identified by comparing the desired separation distance of the features with the optical characteristics of the system used to print the features. The wavelength of the electromagnetic emission and techniques used to print the features can also be considered in identifying proximal features. Such features may be identified from a machine-readable description of a desired feature layout or the features may be identified by empirical studies (such as SEM imaging) of previously printed features where pullback or other effects impair printing.

Once such features are identified, a mask designed to print the gap-forming features may be laid out at 2110. The layout of the mask can include sub-resolution assist features in the gap between the identified gap-forming features. For example, the sub-resolution assist features can bridge the gap between proximal features such as end-to-end proximal features. The sub-resolution assist features can themselves be linear and can be centered on the same centerline on which the proximal features themselves are centered. The sub-resolution assist features can be laid out in high density areas of the mask where dog-ears or hammerheads could interfere with the printing of neighboring features. In some implementations, bridging sub-resolution assist features can be used in conjunction with other sub-resolution assist features such as dogears and hammerheads.

The mask designed to print the gap-forming features is then fabricated at 2115. Certain mask designs can facilitate this fabrication. For example, when sub-resolution assist features bridge an end-to-end gap between substantially linear features, fabrication is facilitated since such line width changes are relatively easy to draw. Once the mask is fabricated, the mask can be used to print features at 2120. The printing can include the fabrication of a microelectronic device.

A number of implementations have been described. Nevertheless, it will be understood that various modifications may be made. For example, proximal features need not be linear. Sub-resolution assist features need not be centered on the same centerline as the proximal features. Sub-resolution assist features need not be strictly linear, nor need sub-resolution assist features bridge the entire gap between proximal features. Accordingly, other implementation are within the scope of the following claims.

What is claimed is:

1. A mask comprising:
    a first line feature and a second line feature separated from each other by a gap, the first line feature and the second line feature being disposed end-to-end to define the gap; and
    a sub-resolution assist feature bridging the gap between end of the first line feature and the end of the second line feature, the sub-resolution assist feature confined between the edges of the first line feature and the second line feature.

2. The mask of claim 1, further comprising a grating pattern including an alternating series of lines and spaces, the sub-resolution assist feature forming a portion of one of the lines.

3. The mask of claim 1, wherein the first line and the second line are defined between a single pair of edges.

4. The mask of claim 1, wherein:
    the first line and the second line are centered on a centerline; and
    the sub-resolution assist feature is disposed in the vicinity of the centerline.

5. The mask of claim 1, wherein the sub-resolution assist feature has a width-to-length ratio of between about 1-to-6 and about 5-to-12.

6. The mask of claim 5, wherein the sub-resolution assist feature has a width-to-length ratio of greater than about 3.5-to-12.

7. The mask of claim 5, wherein the sub-resolution assist feature has a substantially constant width over the entire length.

8. The mask of claim 1, further comprising a neighboring feature laterally adjacent to the gap between the first feature and the second feature.

9. The mask of claim 1, further comprising a second sub-resolution assist feature in the vicinity of the gap.

10. The mask of claim 1, wherein the second sub-resolution assist feature comprises a hammerhead assist feature.

11. The mask of claim 1, wherein the first feature and the second feature comprise apertures to transmit the electromagnetic radiation used to print with the mask.

12. The mask of claim 1, wherein the first feature and a second feature comprise reflective elements to reflect the electromagnetic radiation used to print with the mask.

13. A mask, comprising:
    a first feature and a second feature arranged separated from each other by a gap; and
    a grating pattern including an alternating series of lines and spaces, at least one of the lines forming a substantially linear sub-resolution assist feature bridging the gap between the first feature and the second feature.

14. The mask of claim 13, wherein:
    the first feature comprises a first line feature;
    the second feature comprises a second line feature; and
    the first line feature, the second line feature, and the sub-resolution assist feature are substantially centered on a single centerline.

15. The mask of claim 13, further comprising a neighboring feature laterally adjacent to the gap between the first feature and the second feature.

16. A mask comprising:
    the substantially linear feature having an end; and
    a means for anchoring the printing of the end of the substantially linear feature, the means for anchoring confined between the edges of the substantially linear feature and having a dimension below a resolution limit of a lithography system to print with the mask.

17. The mask of claim 16, further comprising a second substantially linear feature having a second end and arranged end-to-end with the substantially linear feature to form a gap.

18. The mask of claim 17, wherein the means for anchoring bridges the gap.

19. The mask of claim 17, wherein the substantially linear feature and the second substantially linear feature are centered on a centerline and the means for anchoring is disposed in the vicinity of the centerline.

20. The mask of claim 17, wherein the means for anchoring has a width-to-length ratio of between about 1-to-6 and about 5-to-12.

21. The mask of claim 17, wherein the means for anchoring has a width-to-length ratio of greater than about 3.5-to-12.

22. The mask of claim 17, wherein the means for anchoring has a substantially constant width over the entire length.

\* \* \* \* \*